(12) United States Patent
Sokolov et al.

(10) Patent No.: US 7,900,102 B2
(45) Date of Patent: Mar. 1, 2011

(54) HIGH-SPEED PROGRAMMING OF MEMORY DEVICES

(75) Inventors: Dotan Sokolov, Ra'anana (IL); Ofir Shalvi, Ra'anana (IL)

(73) Assignee: Anobit Technologies Ltd., Herzliya Pituach (IL)

( * ) Notice: Subject to any disclaimer, the term of this patent is extended or adjusted under 35 U.S.C. 154(b) by 456 days.

(21) Appl. No.: 11/957,970

(22) Filed: Dec. 17, 2007

(65) Prior Publication Data

US 2008/0148115 A1 Jun. 19, 2008

Related U.S. Application Data

(60) Provisional application No. 60/870,399, filed on Dec. 17, 2006.

(51) Int. Cl.
G11C 29/34 (2006.01)
G11C 29/54 (2006.01)

(52) U.S. Cl. ........................... 714/719; 714/724

(58) Field of Classification Search ................ None
See application file for complete search history.

(56) References Cited

U.S. PATENT DOCUMENTS

| | | | |
|---|---|---|---|
| 4,556,961 A | 12/1985 | Iwahashi et al. |
| 4,558,431 A | 12/1985 | Satoh |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,172,338 A | 12/1992 | Mehrotta et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |

(Continued)

FOREIGN PATENT DOCUMENTS

EP 0783754 B1 7/1997

(Continued)

OTHER PUBLICATIONS

U.S. Appl. No. 12/019,011 Official Action dated Nov. 20, 2009.

(Continued)

*Primary Examiner* — Cynthia Britt
*Assistant Examiner* — Dipakkumar Gandhi
(74) *Attorney, Agent, or Firm* — Fish & Richardson P.C.

(57) ABSTRACT

A method for operating a memory that includes a plurality of analog memory cells includes storing data in a first group of the memory cells by writing respective first cell values to the memory cells in the first group. After storing the data, respective second cell values are read from the memory cells in the first group, and differences are found between the respective first and second cell values for each of one or more of the memory cells in the first group. The differences are processed to produce error information, and the error information is stored in a second group of the memory cells.

41 Claims, 5 Drawing Sheets

U.S. PATENT DOCUMENTS

| | | | |
|---|---|---|---|
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,782 A | 5/1995 | Wells et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,541,886 A | 7/1996 | Hasbun | |
| 5,600,677 A | 2/1997 | Citta et al. | |
| 5,657,332 A | 8/1997 | Auclair et al. | |
| 5,675,540 A | 10/1997 | Roohparvar | |
| 5,696,717 A | 12/1997 | Koh | |
| 5,726,649 A | 3/1998 | Tamaru et al. | |
| 5,742,752 A | 4/1998 | De Koning | |
| 5,751,637 A | 5/1998 | Chen et al. | |
| 5,761,402 A | 6/1998 | Kaneda et al. | |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,429 A | 2/1999 | Chen et al. | |
| 5,877,986 A | 3/1999 | Harari et al. | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,991,517 A | 11/1999 | Harari et al. | |
| 5,995,417 A | 11/1999 | Chen et al. | |
| 6,009,014 A | 12/1999 | Hollmer et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,166,962 A | 12/2000 | Chen et al. | |
| 6,178,466 B1 | 1/2001 | Gilbertson et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,275,419 B1 | 8/2001 | Guterman et al. | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 * | 10/2001 | Engh et al. | 365/185.03 |
| 6,304,486 B1 | 10/2001 | Yano | |
| 6,307,776 B1 | 10/2001 | So et al. | |
| 6,317,363 B1 | 11/2001 | Guterman et al. | |
| 6,317,364 B1 | 11/2001 | Guterman et al. | |
| 6,345,004 B1 * | 2/2002 | Omura et al. | 365/200 |
| 6,360,346 B1 * | 3/2002 | Miyauchi et al. | 714/763 |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,418,060 B1 * | 7/2002 | Yang et al. | 365/185.28 |
| 6,442,585 B1 | 8/2002 | Dean et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,558,967 B1 | 5/2003 | Wong | |
| 6,560,152 B1 | 5/2003 | Cernea | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzalez et al. | |
| 6,643,169 B2 | 11/2003 | Rudelic et al. | |
| 6,678,192 B2 | 1/2004 | Gongwer et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,717,847 B2 | 4/2004 | Chen | |
| 6,731,557 B2 | 5/2004 | Beretta | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,807,095 B2 | 10/2004 | Chen et al. | |
| 6,809,964 B2 | 10/2004 | Moschopoulos et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,894,926 B2 | 5/2005 | Guterman et al. | |
| 6,907,497 B2 | 6/2005 | Hosono et al. | |
| 6,930,925 B2 | 8/2005 | Guo et al. | |
| 6,934,188 B2 | 8/2005 | Roohparvar | |
| 6,937,511 B2 | 8/2005 | Hsu et al. | |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 7,002,843 B2 | 2/2006 | Guterman et al. | |
| 7,012,835 B2 | 3/2006 | Gonzalez et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,042,766 B1 | 5/2006 | Wang et al. | |
| 7,054,193 B1 | 5/2006 | Wong | |
| 7,054,199 B2 | 5/2006 | Lee et al. | |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,079,555 B2 | 7/2006 | Baydar et al. | |
| 7,088,615 B2 | 8/2006 | Guterman et al. | |
| 7,099,194 B2 | 8/2006 | Tu et al. | |
| 7,102,924 B2 | 9/2006 | Chen et al. | |
| 7,113,432 B2 | 9/2006 | Mokhlesi | |
| 7,130,210 B2 | 10/2006 | Bathul et al. | |
| 7,139,192 B1 | 11/2006 | Wong | |
| 7,139,198 B2 | 11/2006 | Guterman et al. | |
| 7,151,692 B2 | 12/2006 | Wu | |
| 7,170,802 B2 | 1/2007 | Cernea et al. | |
| 7,173,859 B2 | 2/2007 | Hemink | |
| 7,177,184 B2 | 2/2007 | Chen | |
| 7,177,195 B2 | 2/2007 | Gonzalez et al. | |
| 7,177,199 B2 | 2/2007 | Chen et al. | |
| 7,177,200 B2 | 2/2007 | Ronen et al. | |
| 7,184,338 B2 | 2/2007 | Nakagawa et al. | |

| Patent No. | Date | Name | | Pub. No. | Date | Name |
|---|---|---|---|---|---|---|
| 7,187,195 B2 | 3/2007 | Kim | | 2004/0160842 A1 | 8/2004 | Fukiage |
| 7,187,592 B2 | 3/2007 | Guterman et al. | | 2005/0007802 A1 | 1/2005 | Gerpheide |
| 7,190,614 B2 | 3/2007 | Wu | | 2005/0013165 A1 | 1/2005 | Ban |
| 7,193,898 B2 | 3/2007 | Cernea | | 2005/0024941 A1 | 2/2005 | Lasser et al. |
| 7,193,921 B2 | 3/2007 | Choi et al. | | 2005/0024978 A1 | 2/2005 | Ronen |
| 7,196,928 B2 | 3/2007 | Chen | | 2005/0086574 A1 | 4/2005 | Fackenthal |
| 7,197,594 B2 | 3/2007 | Raz et al. | | 2005/0121436 A1 | 6/2005 | Kamitani et al. |
| 7,200,062 B2 | 4/2007 | Kinsely et al. | | 2005/0162913 A1 | 7/2005 | Chen |
| 7,221,592 B2 | 5/2007 | Nazarian | | 2005/0169051 A1 | 8/2005 | Khalid et al. |
| 7,224,613 B2 | 5/2007 | Chen et al. | | 2005/0189649 A1 | 9/2005 | Maruyama et al. |
| 7,231,474 B1 | 6/2007 | Helms et al. | | 2005/0213393 A1 | 9/2005 | Lasser |
| 7,231,562 B2 * | 6/2007 | Ohlhoff et al. .............. 714/718 | | 2005/0224853 A1 | 10/2005 | Ohkawa |
| 7,243,275 B2 | 7/2007 | Gongwer et al. | | 2005/0240745 A1 | 10/2005 | Iyer et al. |
| 7,254,690 B2 | 8/2007 | Rao | | 2005/0243626 A1 | 11/2005 | Ronen |
| 7,257,027 B2 | 8/2007 | Park | | 2006/0004952 A1 | 1/2006 | Lasser |
| 7,259,987 B2 | 8/2007 | Chen et al. | | 2006/0028875 A1 | 2/2006 | Avraham et al. |
| 7,266,026 B2 | 9/2007 | Gongwer et al. | | 2006/0028877 A1 | 2/2006 | Meir |
| 7,274,611 B2 | 9/2007 | Roohparvar | | 2006/0101193 A1 | 5/2006 | Murin |
| 7,277,355 B2 | 10/2007 | Tanzawa | | 2006/0107136 A1 | 5/2006 | Gongwer et al. |
| 7,280,398 B1 | 10/2007 | Lee et al. | | 2006/0129750 A1 | 6/2006 | Lee et al. |
| 7,289,344 B2 | 10/2007 | Chen | | 2006/0133141 A1 | 6/2006 | Gorobets |
| 7,301,807 B2 | 11/2007 | Khalid et al. | | 2006/0156189 A1 | 7/2006 | Tomlin |
| 7,301,817 B2 | 11/2007 | Li et al. | | 2006/0179334 A1 | 8/2006 | Brittain et al. |
| 7,308,525 B2 | 12/2007 | Lasser et al. | | 2006/0203546 A1 | 9/2006 | Lasser |
| 7,310,255 B2 | 12/2007 | Chan | | 2006/0218359 A1 | 9/2006 | Sanders et al. |
| 7,310,272 B1 | 12/2007 | Mokhlesi et al. | | 2006/0221705 A1 | 10/2006 | Hemink et al. |
| 7,310,347 B2 | 12/2007 | Lasser | | 2006/0221714 A1 | 10/2006 | Li et al. |
| 7,321,509 B2 | 1/2008 | Chen et al. | | 2006/0239077 A1 | 10/2006 | Park et al. |
| 7,342,831 B2 | 3/2008 | Mokhlesi et al. | | 2006/0256620 A1 | 11/2006 | Nguyen et al. |
| 7,345,928 B2 | 3/2008 | Li | | 2006/0256626 A1 | 11/2006 | Werner et al. |
| 7,349,263 B2 | 3/2008 | Kim et al. | | 2006/0256891 A1 | 11/2006 | Yuan et al. |
| 7,356,755 B2 | 4/2008 | Fackenthal | | 2006/0271748 A1 | 11/2006 | Jain et al. |
| 7,363,420 B2 | 4/2008 | Lin et al. | | 2006/0285392 A1 | 12/2006 | Incarnati et al. |
| 7,397,697 B2 | 7/2008 | So et al. | | 2006/0285396 A1 | 12/2006 | Ha |
| 7,408,804 B2 | 8/2008 | Hemink et al. | | 2007/0006013 A1 | 1/2007 | Moshayedi et al. |
| 7,409,473 B2 | 8/2008 | Conley et al. | | 2007/0019481 A1 | 1/2007 | Park |
| 7,420,847 B2 | 9/2008 | Li | | 2007/0033581 A1 | 2/2007 | Tomlin et al. |
| 7,433,231 B2 | 10/2008 | Aritome | | 2007/0047314 A1 | 3/2007 | Goda et al. |
| 7,437,498 B2 | 10/2008 | Ronen | | 2007/0047326 A1 | 3/2007 | Nguyen et al. |
| 7,440,324 B2 | 10/2008 | Mokhlesi | | 2007/0050536 A1 | 3/2007 | Kolokowsky |
| 7,441,067 B2 | 10/2008 | Gorobetz et al. | | 2007/0058446 A1 | 3/2007 | Hwang et al. |
| 7,453,737 B2 | 11/2008 | Ha | | 2007/0061502 A1 | 3/2007 | Lasser et al. |
| 7,460,410 B2 | 12/2008 | Nagai et al. | | 2007/0067667 A1 | 3/2007 | Ikeuchi et al. |
| 7,460,412 B2 | 12/2008 | Lee et al. | | 2007/0074093 A1 | 3/2007 | Lasser |
| 7,466,592 B2 | 12/2008 | Mitani et al. | | 2007/0086239 A1 | 4/2007 | Litsyn et al. |
| 7,468,911 B2 | 12/2008 | Lutze et al. | | 2007/0086260 A1 | 4/2007 | Sinclair |
| 7,471,581 B2 | 12/2008 | Tran et al. | | 2007/0089034 A1 | 4/2007 | Litsyn et al. |
| 7,492,641 B2 | 2/2009 | Hosono et al. | | 2007/0091677 A1 | 4/2007 | Lasser et al. |
| 7,508,710 B2 | 3/2009 | Mokhlesi | | 2007/0091694 A1 | 4/2007 | Lee et al. |
| 7,539,062 B2 | 5/2009 | Doyle | | 2007/0103978 A1 | 5/2007 | Conley et al. |
| 7,551,492 B2 | 6/2009 | Kim | | 2007/0103986 A1 | 5/2007 | Chen |
| 7,570,520 B2 | 8/2009 | Kamei et al. | | 2007/0109845 A1 | 5/2007 | Chen |
| 7,593,259 B2 | 9/2009 | Kim et al. | | 2007/0109849 A1 | 5/2007 | Chen |
| 7,631,245 B2 | 12/2009 | Lasser | | 2007/0118713 A1 | 5/2007 | Guterman et al. |
| 7,633,802 B2 | 12/2009 | Mokhlesi | | 2007/0143378 A1 | 6/2007 | Gorobetz |
| 7,660,158 B2 | 2/2010 | Aritome | | 2007/0143531 A1 | 6/2007 | Atri |
| 7,742,351 B2 | 6/2010 | Inoue et al. | | 2007/0159889 A1 | 7/2007 | Kang et al. |
| 2001/0002172 A1 * | 5/2001 | Tanaka et al. .......... 365/185.22 | | 2007/0159892 A1 | 7/2007 | Kang et al. |
| 2001/0006479 A1 | 7/2001 | Ikehashi et al. | | 2007/0159907 A1 | 7/2007 | Kwak |
| 2002/0038440 A1 * | 3/2002 | Barkan ...................... 714/746 | | 2007/0168837 A1 | 7/2007 | Murin |
| 2002/0118574 A1 | 8/2002 | Gongwer et al. | | 2007/0171714 A1 | 7/2007 | Wu et al. |
| 2002/0174295 A1 | 11/2002 | Ulrich et al. | | 2007/0183210 A1 | 8/2007 | Choi et al. |
| 2002/0196510 A1 | 12/2002 | Hietala et al. | | 2007/0189073 A1 | 8/2007 | Aritome |
| 2003/0002348 A1 | 1/2003 | Chen et al. | | 2007/0195602 A1 | 8/2007 | Fong et al. |
| 2003/0103400 A1 | 6/2003 | Van Tran | | 2007/0206426 A1 | 9/2007 | Mokhlesi |
| 2003/0161183 A1 | 8/2003 | Tran | | 2007/0208904 A1 | 9/2007 | Hsieh et al. |
| 2003/0189856 A1 | 10/2003 | Cho et al. | | 2007/0226599 A1 | 9/2007 | Motwani |
| 2004/0057265 A1 | 3/2004 | Mirabel et al. | | 2007/0236990 A1 | 10/2007 | Aritome |
| 2004/0057285 A1 | 3/2004 | Cernea et al. | | 2007/0253249 A1 | 11/2007 | Kang et al. |
| 2004/0083333 A1 | 4/2004 | Chang et al. | | 2007/0256620 A1 | 11/2007 | Viggiano et al. |
| 2004/0083334 A1 | 4/2004 | Chang et al. | | 2007/0266232 A1 | 11/2007 | Rodgers et al. |
| 2004/0105311 A1 | 6/2004 | Cernea et al. | | 2007/0271424 A1 | 11/2007 | Lee et al. |
| 2004/0114437 A1 | 6/2004 | Li | | 2007/0280000 A1 | 12/2007 | Fujiu et al. |

| | | | |
|---|---|---|---|
| 2008/0010395 A1 | 1/2008 | Mylly et al. | |
| 2008/0025121 A1 | 1/2008 | Tanzawa | |
| 2008/0043535 A1 | 2/2008 | Roohparvar | |
| 2008/0049504 A1 | 2/2008 | Kasahara et al. | |
| 2008/0049506 A1 | 2/2008 | Guterman | |
| 2008/0055993 A1 | 3/2008 | Lee | |
| 2008/0080243 A1 | 4/2008 | Edahiro et al. | |
| 2008/0082730 A1 | 4/2008 | Kim et al. | |
| 2008/0089123 A1 | 4/2008 | Chae et al. | |
| 2008/0104309 A1 | 5/2008 | Cheon et al. | |
| 2008/0104312 A1 | 5/2008 | Lasser | |
| 2008/0109590 A1 | 5/2008 | Jung et al. | |
| 2008/0115017 A1 | 5/2008 | Jacobson | |
| 2008/0123420 A1 | 5/2008 | Brandman et al. | |
| 2008/0126686 A1 | 5/2008 | Sokolov et al. | |
| 2008/0130341 A1 | 6/2008 | Shalvi et al. | |
| 2008/0148115 A1 | 6/2008 | Sokolov et al. | |
| 2008/0151667 A1 | 6/2008 | Miu et al. | |
| 2008/0158958 A1 | 7/2008 | Sokolov et al. | |
| 2008/0181001 A1 | 7/2008 | Shalvi | |
| 2008/0198650 A1 | 8/2008 | Shalvi et al. | |
| 2008/0209116 A1 | 8/2008 | Caulkins | |
| 2008/0209304 A1 | 8/2008 | Winarski et al. | |
| 2008/0215798 A1 | 9/2008 | Sharon et al. | |
| 2008/0219050 A1 | 9/2008 | Shalvi et al. | |
| 2008/0239093 A1 | 10/2008 | Easwar et al. | |
| 2008/0239812 A1 | 10/2008 | Abiko et al. | |
| 2008/0263262 A1 | 10/2008 | Sokolov et al. | |
| 2008/0282106 A1 | 11/2008 | Shalvi et al. | |
| 2009/0024905 A1 | 1/2009 | Shalvi et al. | |
| 2009/0034337 A1 | 2/2009 | Aritome | |
| 2009/0043831 A1 | 2/2009 | Antonopoulos et al. | |
| 2009/0043951 A1 | 2/2009 | Shalvi et al. | |
| 2009/0049234 A1 | 2/2009 | Oh et al. | |
| 2009/0073762 A1 | 3/2009 | Lee et al. | |
| 2009/0086542 A1 | 4/2009 | Lee et al. | |
| 2009/0089484 A1 | 4/2009 | Chu | |
| 2009/0091979 A1 | 4/2009 | Shalvi | |
| 2009/0094930 A1 | 4/2009 | Schwoerer | |
| 2009/0106485 A1 | 4/2009 | Anholt | |
| 2009/0112949 A1 | 4/2009 | Ergan et al. | |
| 2009/0132755 A1 | 5/2009 | Radke | |
| 2009/0144600 A1 | 6/2009 | Perlmutter et al. | |
| 2009/0150894 A1 | 6/2009 | Huang et al. | |
| 2009/0172257 A1 | 7/2009 | Prins et al. | |
| 2009/0172261 A1 | 7/2009 | Prins et al. | |
| 2009/0204824 A1 | 8/2009 | Lin et al. | |
| 2009/0204872 A1 | 8/2009 | Yu et al. | |
| 2009/0225595 A1 | 9/2009 | Kim | |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann et al. | |
| 2010/0017650 A1 | 1/2010 | Chin et al. | |
| 2010/0034022 A1 | 2/2010 | Dutta et al. | |
| 2010/0057976 A1 | 3/2010 | Lasser | |
| 2010/0061151 A1 | 3/2010 | Miwa et al. | |
| 2010/0142277 A1 | 6/2010 | Yang et al. | |

FOREIGN PATENT DOCUMENTS

| | | | |
|---|---|---|---|
| EP | 1434236 B1 | 6/2004 | |
| EP | 1605509 A1 | 12/2005 | |
| WO | 9610256 A1 | 4/1996 | |
| WO | 9828745 A1 | 7/1998 | |
| WO | 02100112 A1 | 12/2002 | |
| WO | 2007046084 A2 | 4/2007 | |
| WO | 2007132452 A2 | 11/2007 | |
| WO | 2007132453 A2 | 11/2007 | |
| WO | 2007132456 A2 | 11/2007 | |
| WO | 2007132457 A2 | 11/2007 | |
| WO | 2007132458 A2 | 11/2007 | |
| WO | 2007146010 A2 | 12/2007 | |
| WO | 2008026203 A2 | 3/2008 | |
| WO | 2008053472 A2 | 5/2008 | |
| WO | 2008053473 A2 | 5/2008 | |
| WO | 2008068747 A2 | 6/2008 | |
| WO | 2008077284 A1 | 7/2008 | |
| WO | 2008083131 A2 | 7/2008 | |
| WO | 2008099958 A1 | 8/2008 | |
| WO | 2008111058 A2 | 9/2008 | |
| WO | 2008124760 A2 | 10/2008 | |
| WO | 2008139441 A2 | 11/2008 | |
| WO | 2009037691 A2 | 3/2009 | |
| WO | 2009037697 A2 | 3/2009 | |
| WO | 2009050703 A2 | 4/2009 | |
| WO | 2009053961 A2 | 4/2009 | |
| WO | 2009053962 A2 | 4/2009 | |
| WO | 2009053963 A2 | 4/2009 | |
| WO | 2009072100 A2 | 6/2009 | |
| WO | 2009072101 A2 | 6/2009 | |
| WO | 2009072102 A2 | 6/2009 | |
| WO | 2009072103 A2 | 6/2009 | |
| WO | 2009072104 A2 | 6/2009 | |
| WO | 2009072105 A2 | 6/2009 | |
| WO | 2009074978 A2 | 6/2009 | |
| WO | 2009074979 A2 | 6/2009 | |
| WO | 2009078006 A2 | 6/2009 | |
| WO | 2009095902 A2 | 8/2009 | |

OTHER PUBLICATIONS

Takeuchi et al., "A Multipage Cell Architecture for High-Speed Programming Multilevel NAND Flash Memories", IEEE Journal of Solid State Circuits, vol. 33, No. 8, Aug. 1998.

U.S. Appl. No. 11/949,135 Official Action dated Oct. 2, 2009.

Agrell et al., "Closest Point Search in Lattices", IEEE Transactions on Information Theory, vol. 48, No. 8, pp. 2201-2214, Aug. 2002.

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW' 2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

International Application PCT/IL2008/001446 "Optimized selection of memory chips in multi-chip memory devices" filed on Nov. 4, 2008.

Shalvi et al., U.S. Appl. No. 12/251,471 "Compensation for Voltage Drifts in Analog Memory Cells" filed Oct. 15, 2008.

Kasorla et al, U.S. Appl. No. 12/332,370 "Efficient Data Storage in Multi-Plane Memory Devices" filed Dec. 11, 2008.

Sommer, N., U.S. Appl. No. 12/364,531 "Parameter Estimation Based on Error Correction Code Parity Check Equations" filed Feb. 3, 2009.

Golov et al., U.S. Appl. No. 12/344,233 "Wear Level Estimation in Analog Memory Cells" filed Dec. 25, 2008.

Perlmutter et al., U.S. Appl. No. 12/388,528 "Programming of Analog Memory Cells Using a Single Programming Pulse per State Transition" filed Feb. 19, 2009.

Perlmutter et al., U.S. Appl. No. 12/390,522 "Programming Analog Memory Cells for Reduced Variance After Retention" filed Feb. 23, 2009.

Perlmutter et al., U.S. Appl. No. 12/405,275 "Memory Device with Multiple-Accuracy Read Commands" filed Mar. 17, 2009.

Perlmutter et al., U.S. Appl. No. 12/397,368 "Efficient Readout from Analog Memory Cells Using Data Compression" filed Mar. 4, 2009.

Sommer, N., U.S. Appl. No. 12/171,797 "Memory Device with Non-Uniform Programming Levels" filed Jul. 11, 2008.

Perlmutter et al, U.S. Appl. No. 12/332,368 "Efficient Interference Cancellation in Analog Memory Cell Arrays" filed Dec. 11, 2008.

JEDEC Standard JESD84-C44, "Embedded MultiMediaCard (e•MMC) Mechanical Standard, with Optional Reset Signal", Jedec Solid State Technology Association, USA, Jul. 2009.

JEDEC, "UFS Specification", version 0.1, Nov. 11, 2009.

SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

Shalvi et al., U.S. Appl. No. 12/822,207 "Adaptive Over-Provisioning in Memory Systems" filed Jun. 24, 2010.

U.S. Appl. No. 12/880,101 "Reuse of Host Hibernation Storage Space by Memory Controller", filed on Sep. 12, 2010.

U.S. Appl. No. 12/890,724 "Error Correction Coding Over Multiple Memory Pages.", filed on Sep. 27, 2010.

U.S. Appl. No. 12/171,797 Official Action dated Aug. 25, 2010.

U.S. Appl. No. 12/497,707 Official Action dated Sep. 15, 2010.

U.S. Appl. No. 11/995,801 Official Action dated Oct. 15, 2010.

Numonyx, "M25PE 16: 16-Mbit, page-erasable serial flash memory with byte-alterability, 75 MHz SPI bus, standard pinout", Apr. 2008.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

U.S. Appl. No. 12/045,520 Official Action dated Nov. 16, 2010.

U.S. Appl. No. 12/388,528 Official Action dated Nov. 29, 2010.

Engineering Windows 7, "Support and Q&A for Solid-State Drives", e7blog, May 5, 2009.

US 7,161,836, 01/2007, Wan et al. (withdrawn)

* cited by examiner

HIGH-SPEED PROGRAMMING OF MEMORY DEVICES

CROSS-REFERENCE TO RELATED APPLICATIONS

This application claims the benefit of U.S. Provisional Patent Application 60/870,399, filed Dec. 17, 2006, whose disclosure is incorporated herein by reference.

FIELD OF THE INVENTION

The present invention relates generally to memory devices, and particularly to methods and systems for high-speed programming of analog memory cells.

BACKGROUND OF THE INVENTION

Several types of memory devices, such as Flash memories, use arrays of analog memory cells for storing data. Each analog memory cell stores a quantity of an analog value, such as an electrical charge or voltage, which represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Analog memory cells are often programmed using Program and Verify (P&V) processes. In a typical P&V process, a cell is programmed by applying a sequence of voltage pulses, whose voltage level increases from pulse to pulse. The programmed voltage level is read ("verified") after each pulse, and the iterations continue until the desired level is reached.

Various methods for increasing the speed of memory device programming are known in the art. For example, U.S. Pat. No. 7,177,200, whose disclosure is incorporated herein by reference, describes a method that initially programs a Flash memory device in a quick manner that produces relatively broad threshold voltage distributions, which would render the flash memory unreliable in the long term if left uncorrected. Then, while the host of the memory device is idle, the memory device shifts and tightens up its threshold voltage distributions sufficiently to obtain long-term reliability.

U.S. Patent Application Publication 2002/0118574, whose disclosure is incorporated herein by reference, describes a programming method, which programs each cell to its target state using a data-dependent programming voltage. In some embodiments, the programming operation is performed in multiphase wherein each successive phase is executed with a finer programming resolution, such as by employing a programming voltage with a gentler staircase waveform.

U.S. Pat. No. 6,301,151, whose disclosure is incorporated herein by reference, describes an adaptive programming method for Flash memory analog storage. The voltage of a programming pulse is adjusted based on the result of the previous pulse. The expected change in the programmed value is compared to the measured change, and the difference used to improve the model of that cell after each programming pulse.

U.S. Patent Application Publication 2006/0285396, whose disclosure is incorporated herein by reference, describes a programming process, which increases the programming voltage of successive programming cycles in relation to the percentage of the data bits that failed programming verification during the previous programming cycle and were not correctly programmed into the memory array.

SUMMARY OF THE INVENTION

Embodiments of the present invention provide a method for operating a memory that includes a plurality of analog memory cells, including:

storing data in a first group of the memory cells by writing respective first cell values to the memory cells in the first group;

after storing the data, reading respective second cell values from the memory cells in the first group, and finding differences between the respective first and second cell values for each of one or more of the memory cells in the first group;

processing the differences to produce error information; and storing the error information in a second group of the memory cells.

In some embodiments, the second group of the memory cells is different from the first group. In an embodiment, writing the first cell values and reading the second cell values include programming the memory cells of the first group in an iterative Program and Verify (P&V) process.

In another embodiment, processing the differences includes quantizing the differences by mapping the differences to a finite set of difference indications, and storing the error information includes storing the quantized differences. Processing the differences may include adaptively controlling a size of the produced error information responsively to the quantized differences.

Typically, storing the data includes selecting the first cell values from a set of nominal values, and the difference indications indicate whether the nominal values corresponding to the read second cell values differ from the respective nominal values corresponding to the written first cell values. In some embodiments, for a given first cell value that corresponds to a first nominal value and a given second cell value that corresponds to a second nominal value, the difference indications include at least one of:

a first indication indicating that the first nominal value is lower than and adjacent to the second nominal value in the set of the nominal values;

a second indication indicating that the first nominal value is greater than and adjacent to the second nominal value in the set of the nominal values; and a third indication indicating that the first nominal value is equal to the second nominal value.

In a disclosed embodiment, storing the error information includes compressing the error information and storing the compressed error information. Additionally or alternatively, storing the error information may include encoding the error information with an Error Correction Code (ECC) and storing the encoded error information. Further additionally or alternatively, storing the error information may include storing indices of the memory cells of the first group in which the differences were found.

In another embodiment, reading the second cell values and finding the differences are performed immediately after writing the first cell values, a predetermined time interval after writing the first cell values, and/or responsively to an event. In yet another embodiment, the memory cells in the first group are subject to interference from a third group of the memory cells, and reading the second cell values and finding the differences are performed after the memory cells in the third group have been programmed.

In some embodiments, the method further includes retrieving the stored data by retrieving the error information from the second group of the memory cells, reading third cell values from the cells in the first group, and processing the third cell values responsively to the retrieved error information to produce corrected data. Retrieving the stored data may include making an attempt to reconstruct the data from the third cell values without the error information, and retrieving the error information and processing the third cell values responsively to the retrieved error information upon a failure of the attempt.

In another embodiment, storing the data includes encoding the data with a code that detects errors in the data, and retrieving the stored data includes detecting the errors in the data using the code and updating the error information based on the third cell values when a number of the detected errors meets a predetermined condition. Updating the error information may be performed when the number of the detected errors exceeds a predetermined threshold.

In some embodiments, storing the data includes programming the first memory cells using first programming parameters such that the error information has a first size, and the method includes, after storing the error information:

reading the error information from the second group of the memory cells, reading third cell values from the cells in the first group, and reconstructing the data by processing the third cell values responsively to the read error information; and re-programming the data using second programming parameters so as to produce refined error information having a second size, which is smaller than the first size.

There is additionally provided, in accordance with an embodiment of the present invention, apparatus for operating a memory that includes a plurality of analog memory cells, including:

Read/Write (R/W) circuitry, which is coupled to store data in a first group of the memory cells by writing respective first cell values to the memory cells in the first group and, after storing the data, to read respective second cell values from the analog memory cells in the first group; and a processor, which is configured to find differences between the respective first and second cell values for each of one or more of the memory cells in the first group, to process the differences to produce error information and to store the error information in a second group of the memory cells.

There is also provided, in accordance with an embodiment of the present invention, apparatus for data storage, including:

a memory, which includes a plurality of analog memory cells;

Read/Write (R/W) circuitry, which is coupled to store data in a first group of the memory cells by writing respective first cell values to the memory cells in the first group and, after storing the data, to read respective second cell values from the analog memory cells in the first group; and a processor, which is configured to find differences between the respective first and second cell values for each of one or more of the memory cells in the first group, to process the differences to produce error information and to store the error information in a second group of the memory cells.

The present invention will be more fully understood from the following detailed description of the embodiments thereof, taken together with the drawings in which:

DETAILED DESCRIPTION OF EMBODIMENTS

Overview

Figure 1:
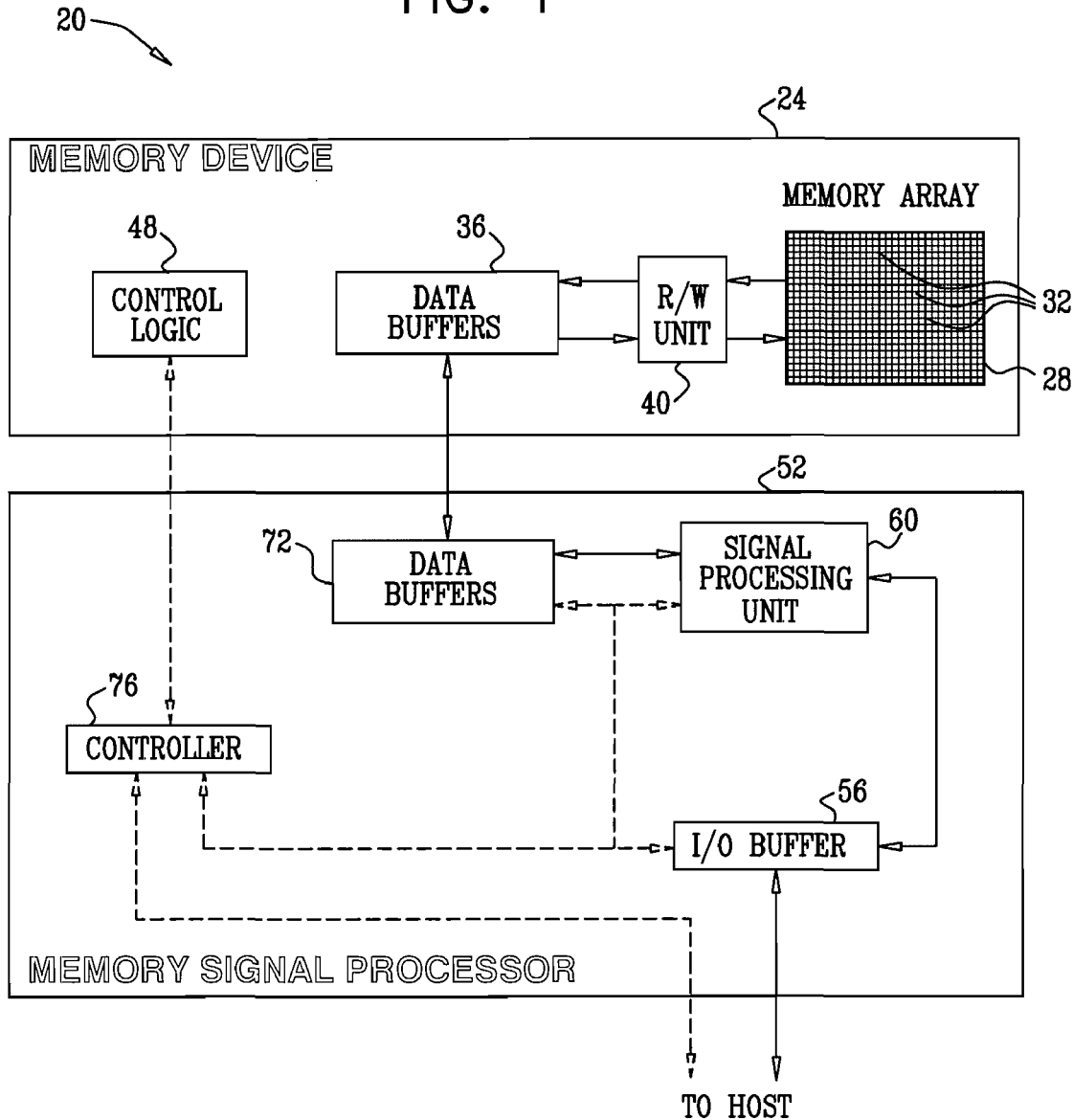
FIG. 1 is a block diagram that schematically illustrates a system for memory signal processing, in accordance with an embodiment of the present invention.

Iterative Program and verify (P&V) processes are characterized by a P&V step size, i.e., the increment in magnitude between successive programming pulses. The choice of P&V step size has considerable influence on memory device performance. In particular, the step size value sets a trade-off between the programming accuracy and the programming speed of the memory cells. When using a large P&V step size, cells can be programmed using a relatively small number of pulses, but the programming accuracy is degraded. The coarse programming accuracy often causes poorer error performance and/or lower storage capacity, especially in MLC devices. Programming the cells with a small P&V step size, on the other hand, achieves high accuracy (and consequently smaller error probability and higher capacity) at the expense of slower programming.

Embodiments of the present invention that are described hereinbelow provide improved methods and systems for operating arrays of analog memory cells. These methods and systems achieve high-accuracy programming of the cells while using a coarse P&V step size, and therefore provide an improved trade-off between accuracy and programming speed. As a result, systems that use the programming methods described herein can provide high-speed programming, high storage capacity and low error probabilities simultaneously.

In addition to increasing programming speed, the methods and systems described herein also assist in slowing down the wear of memory cells and in reducing the level of program disturb interference. Since programming cells with a small P&V step size often increases the stress and wearing of the cells and causes more program disturbs to other cells, the use of coarse P&V step size helps to reduce both of these undesirable effects.

In some embodiments, a Memory Signal Processor (MSP) stores data in an array of analog memory cells. The memory cell array is divided into a data storage area and an error storage area. Data is written to the memory cells of the data storage area in a fast P&V process that uses a coarse step size. As a result of the coarse step size, the analog values that are actually written to the cells may deviate from the intended target levels by respective residual programming errors. The MSP measures the residual errors, and stores information related to the residual errors in the error storage area of the memory cell array. When reading the cells, the MSP reads the error information from the error storage area, and combines it with the data read from the data storage area, so as to reconstruct the data with high accuracy.

The MSP may measure the residual errors and store the error information at any time, e.g., immediately following programming of the cells, after a certain time interval or in response to a certain event or condition. Delaying the measurement of the residual errors is sometimes advantageous, as it enables the MSP to compensate for various impairments that affect the cell values.

In some embodiments, the data stored in the data storage area is encoded with an Error Correction Code (ECC) having a finite correction capability. In these embodiments, the MSP may measure the residual errors and store the error information when the number of errors corrected by the ECC is close the correction capability of the code. Thus, the effective correction capability of the ECC is improved considerably.

System Description

FIG. 1 is a block diagram that schematically illustrates a system 20 for memory signal processing, in accordance with an embodiment of the present invention. System 20 can be used in various host systems and devices, such as in computing devices, cellular phones or other communication terminals, removable memory modules ("disk-on-key" devices), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. The analog values are also referred to herein as cell values.

Array 28 may comprise analog memory cells of any kind, such as, for example, NAND, NOR and CTF Flash cells, PCM, NROM, FRAM, MRAM and DRAM cells. The charge levels stored in the cells and/or the analog voltages or currents written into and read out of the cells are referred to herein collectively as analog values.

System 20 stores data in the analog memory cells by programming the cells to assume respective memory states. The memory states are selected from a finite set of possible states, and each state corresponds to a certain nominal analog value. For example, a 2 bit/cell MLC can be programmed to assume one of four possible memory states by writing one of four possible nominal analog values into the cell.

Data for storage in memory device 24 is provided to the device and cached in data buffers 36. The data is then converted to analog voltages and written into memory cells 32 using a reading/writing (R/W) unit 40, whose functionality is described in greater detail below. When reading data out of array 28, R/W unit 40 converts the electrical charge, and thus the analog voltages of memory cells 32, into digital samples having a resolution of one or more bits. The samples are cached in buffers 36. The operation and timing of memory device 24 is managed by control logic 48.

The storage and retrieval of data in and out of memory device 24 is performed by a Memory Signal Processor (MSP) 52. MSP 52 comprises a signal processing unit 60, which processes the data that is written into and read from device 24.

In some embodiments, unit 60 encodes the data to be written into the memory cells using an Error Correction Code (ECC), and decodes the ECC of the retrieved data. Unit 60 may use any suitable type of ECC. ECC schemes that may be used by unit 60 may comprise, for example, various block codes such as Bose-Chaudhuri-Hocquenghem (BCH) codes, Reed-Solomon (RS) codes, Low Density Parity Check (LDPC) codes, turbo codes or a turbo product codes (TPC). Alternatively, unit 60 may use a convolutional ECC, a concatenated ECC, a trellis code or other signal-space code, or a multi-level ECC.

In particular, MSP 52 carries out methods for high-speed, high-accuracy programming of cells 32, as will be described in detail below.

MSP 52 comprises a data buffer 72, which is used by unit 60 for storing data and for interfacing with memory device 24. MSP 52 also comprises an Input/Output (I/O) buffer 56, which forms an interface between the MSP and the host system. A controller 76 manages the operation and timing of MSP 52. Signal processing unit 60 and controller 76 may be implemented in hardware. Alternatively, unit 60 and/or controller 76 may comprise microprocessors that run suitable software, or a combination of hardware and software elements.

The configuration of FIG. 1 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 52 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which memory array 28 is disposed. Further alternatively, some or all of the functionality of MSP 52 can be implemented in software and carried out by a processor or other element of the host system. In some implementations, a single MSP 52 may be connected to multiple memory devices 24.

In a typical writing operation, data to be written into memory device 24 is accepted from the host and cached in I/O buffer 56. The data is transferred, via data buffers 72, to memory device 24. The data may be pre-processed by MSP 52 before it is transferred to the memory device for programming. For example, unit 60 may encode the data using an ECC, add certain data for internal use, and/or scramble the data. In device 24 the data is temporarily stored in buffers 36. R/W unit 40 converts the data to nominal analog values and writes the nominal values into the appropriate cells 32 of array 28.

In a typical reading operation, R/W unit 40 reads analog values out of the appropriate memory cells 32 and converts them to soft digital samples. The samples are cached in buffers 36 and transferred to buffers 72 of MSP 52. In some embodiments, unit 60 of MSP 52 converts the samples to data bits.

Figure 2:
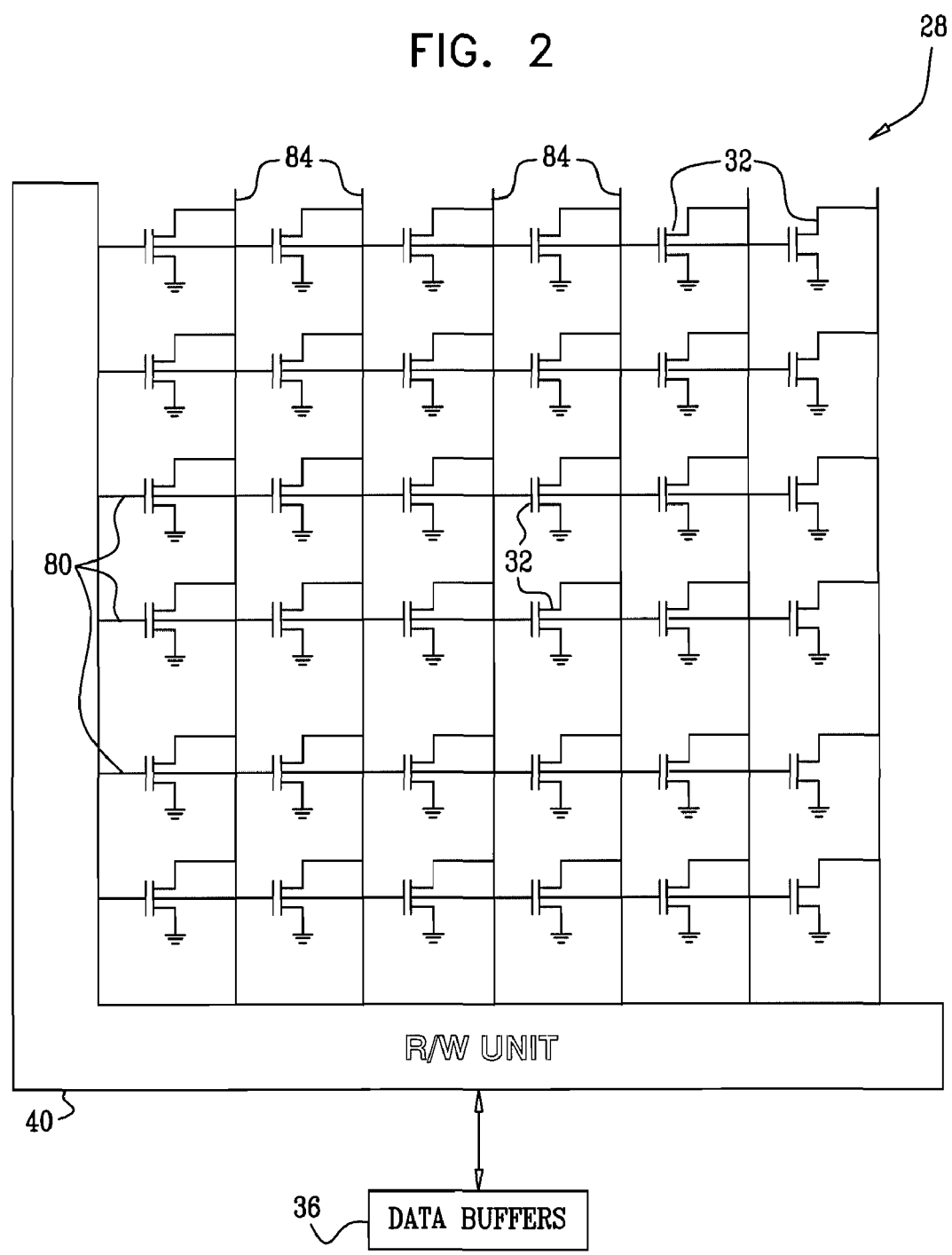
FIG. 2 is a diagram that schematically illustrates a memory cell array, in accordance with an embodiment of the present invention.

FIG. 2 is a diagram that schematically illustrates memory cell array 28, in accordance with an embodiment of the present invention. Although FIG. 2 refers to Flash memory cells that are connected in a particular array configuration, the principles of the present invention are applicable to other types of memory cells and other array configurations, as well. Some exemplary cell types and array configurations are described in the references cited in the Background section above.

Memory cells 32 of array 28 are arranged in a grid having multiple rows and columns. Each cell 32 comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

In the exemplary configuration of FIG. 2, the gates of the transistors in each row are connected by word lines 80. The sources of the transistors in each column are connected by bit lines 84. In some embodiments, such as in some NOR cell devices, the sources are connected to the bit lines directly. In alternative embodiments, such as in some NAND cell devices, the bit lines are connected to strings of floating-gate cells.

The memory cell array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some SLC devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per-cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

High-Speed Programming Methods

R/W unit 40 programs memory cells 32 of array 28 using an iterative Program and Verify (P&V) process, as is known in the art. The P&V process is usually applied simultaneously to a certain memory page. When programming a given page, the R/W unit applies a train of incrementally-increasing programming pulses to the cells of the page. The level of each pulse is higher than the previous pulse by a certain step size. The R/W unit reads the analog values of the cells following each pulse and checks whether the analog values stored in the cells (e.g., threshold voltages) have reached their intended target levels.

The R/W unit stops applying pulses to cells that have reached their target levels. The iterations continue selectively, programming for the cells that have not yet reached the desired levels. The iterative process typically continues until all cells in the page are successfully programmed, or until a predetermined maximum number of iterations are performed. Note that different cells in the page may have different target levels, such as because they are to be programmed with different data. Moreover, the number of iterations needed to reach a certain level may vary statistically from cell to cell.

As noted above, the choice of P&V step size sets a trade-off between the programming accuracy and the programming speed of the cells. When using a large P&V step size, cells can be programmed using a relatively small number of pulses, but the programming accuracy is poorer. Coarse programming accuracy often translates to poorer error performance and/or lower storage capacity, especially in MLC devices. When using a small P&V step size, on the other hand, high accuracy can be achieved at the expense of slower programming.

Embodiments of the present invention provide improved methods and systems for programming analog memory cells, which achieve high-accuracy programming of the cells while using a coarse P&V step size, and therefore provide an improved trade-off between accuracy and programming speed. In some embodiments that are described in detail below, the memory cell array is divided into a data storage area and an error storage area. Data is written to the memory cells of the data storage area in a fast P&V process that uses a coarse step size. As a result of the coarse step size, the analog values that are actually written to the cells may deviate from the intended target levels by respective residual programming errors. The MSP estimates the residual errors, and stores information related to the residual errors in the error storage area of the memory cell array. This information is referred to herein as "error information." When reading the cells, the MSP reads the error information from the error storage area, and combines it with the data read from the data storage area, so as to reconstruct the data with high accuracy.

Figure 3:
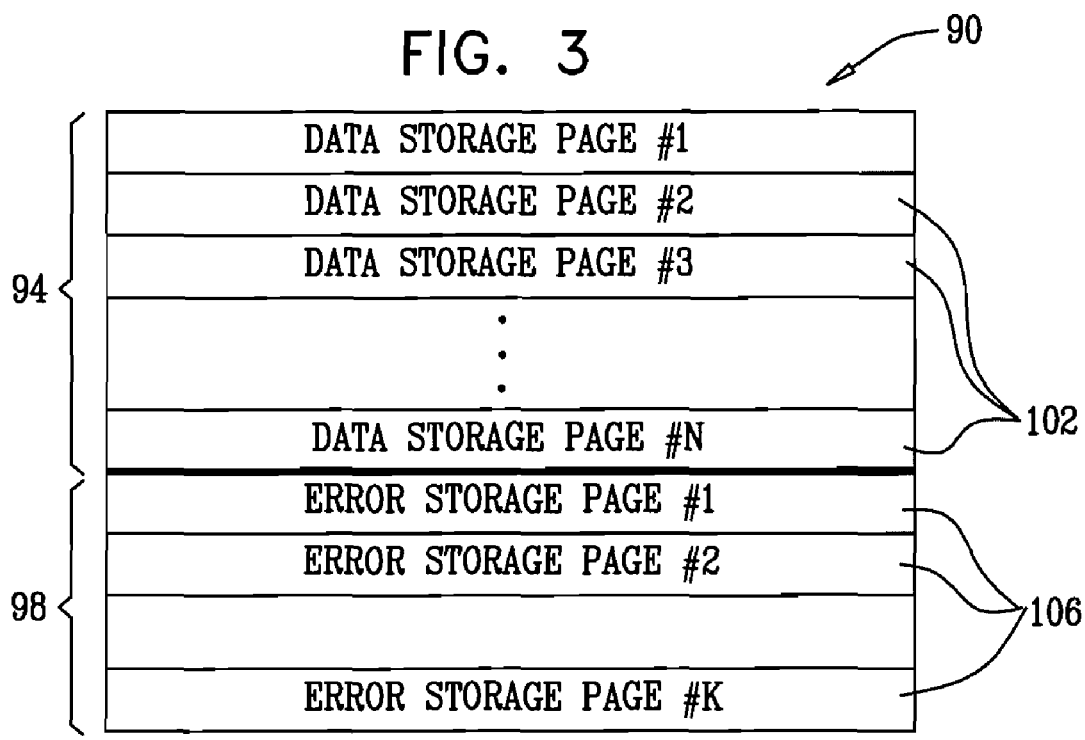
FIG. 3 is a diagram that schematically illustrates a memory partitioned into data storage and error storage areas, in accordance with an embodiment of the present invention.

FIG. 3 is a diagram that schematically illustrates a memory cell array 90, in accordance with an embodiment of the present invention. Array 90 comprises multiple memory pages, and is partitioned into a data storage area 94 and an error storage area 98. The data storage area comprises N data storage pages 102, and the error storage area comprises K error storage pages 106. K is typically much smaller than N. Array 90 may comprise, for example, a single erasure block, several erasure blocks or any other suitable set of pages. MSP 52 stores data and error information in areas 94 and 98, respectively. For example, some or all of array 28 in the configuration of FIG. 1 above can be partitioned in this manner.

Although the example of FIG. 3 shows a configuration in which the data storage area and the error storage area comprise separate sets of memory pages, the methods and systems described herein are not limited to such configurations. The data storage area and the error storage area may comprise any suitable groups of memory cells, or even individual bits within memory cells, which may reside in separate or overlapping sectors, pages, blocks, planes, dies or memory devices.

For example, the error information of a certain page or word line can be stored in some of the cells of a subsequent page or word line. Using this technique, some of the cells in each page or word line are used for storing data and some are used for storing error information of another page or word line. In some embodiments, the error information is encoded with an ECC for extra protection.

Figure 4:
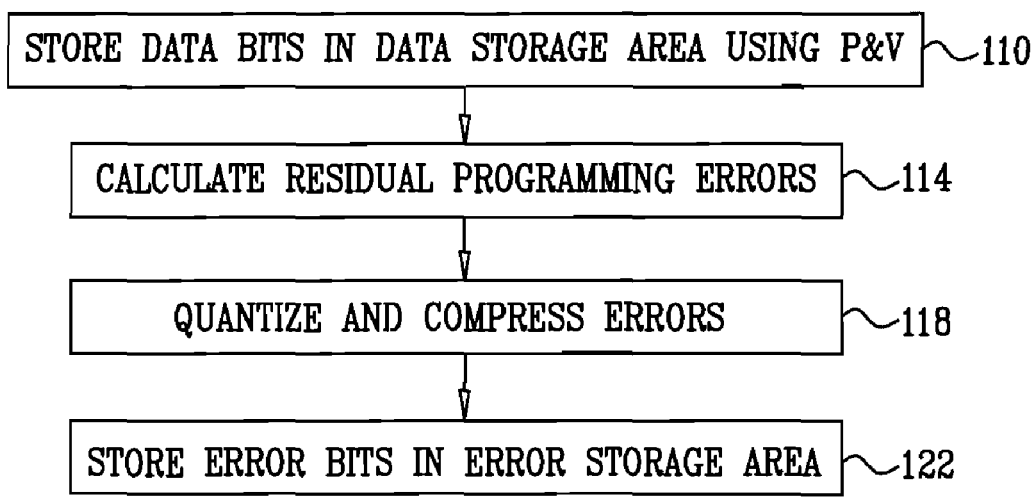
FIG. 4 is a flow chart that schematically illustrates a method for storing data in a memory cell array, in accordance with an embodiment of the present invention.

FIG. 4 is a flow chart that schematically illustrates a method for storing data in a memory cell array, in accordance with an embodiment of the present invention. The array is assumed to be partitioned into a data storage area and an error storage area, as described above.

The method begins with MSP 52 accepting data for storage in the memory array. The MSP stores the data in the data storage area, at a data storage step 110. The MSP maps the data to corresponding analog values, and R/W unit 40 writes these values to the cells. The R/W unit programs the cells using a fast P&V process that uses a coarse P&V step size. As a result, the analog values that are actually stored in the cells may deviate from the intended values by respective residual errors.

The MSP determines the residual errors, at an error calculation step 114. For example, the MSP may read the analog values from the cells and compare them with the target values the cells were intended to hold. The MSP may determine the residual errors based on quantized values of the analog values, such as by performing hard read operations that compare the analog values to certain read thresholds, and determining the residual errors based on the comparison results. In other words, the residual error of a certain analog value, which was expected to fall in a certain interval of analog values, can be based on whether or not the analog value falls inside or outside of this interval.

In some embodiments, e.g., when the error measurement is carried out immediately following programming of the cells, the MSP uses the analog values that were already read from the cells in the last verify operation for this purpose. Alternatively, the MSP may read the cells and measure the residual errors at a later time, as described further below. Further alternatively, the memory device may report the residual errors to the MSP.

The MSP quantizes and compresses the residual errors, at a quantization and compression step 118. The MSP stores the quantized and compressed residual errors in the error storage area, at an error storage step 122. In some embodiments, the MSP encodes the error information using an ECC before storing it. In the example of FIG. 4, the MSP uses the quantized and compressed error magnitudes as the error information. In alternative embodiments, other types of error information can also be used. Several examples are described further below.

The R/W unit programs the cells at high speed, by using a coarse P&V step size. The additional programming operations needed for storing the residual errors incur some overhead. Nevertheless, the P&V process parameters (e.g., the step size and the maximum number of iterations) are chosen so that the overall programming speed is considerably improved, in comparison to a scheme that uses a fine P&V step size.

The overall programming time of a block comprising N data storage pages and K error storage pages is reduced by a factor of $$T_{RATIO} = \frac{N \cdot T_{FAST} + K \cdot T_{REGULAR}}{N \cdot T_{REGULAR}} = \frac{T_{FAST}}{T_{REGULAR}} + \frac{K}{N}\bigg|_{N \gg K} \approx \frac{T_{FAST}}{T_{REGULAR}}$$

wherein $T_{FAST}$ denotes the page programming time using the coarse P&V step size and $T_{REGULAR}$ denotes the page programming time using a fine P&V step size used as reference. In the equation above, the pages in the error storage area are assumed to be programmed with the fine P&V step size. In alternative embodiments, however, the pages in the error storage area may be programmed with any suitable P&V step size, such as using the coarse P&V step size used for programming the pages in the data storage area.

Since K out of the total N+K pages are allocated to error storage, the data capacity of the block is reduced by a factor of $C_{RATIO}=N/(N+K)$. Both $T_{RATIO}$ and $C_{RATIO}$ can be adjusted by changing the P&V step size and the maximum number of P&V iterations.

Figure 5:
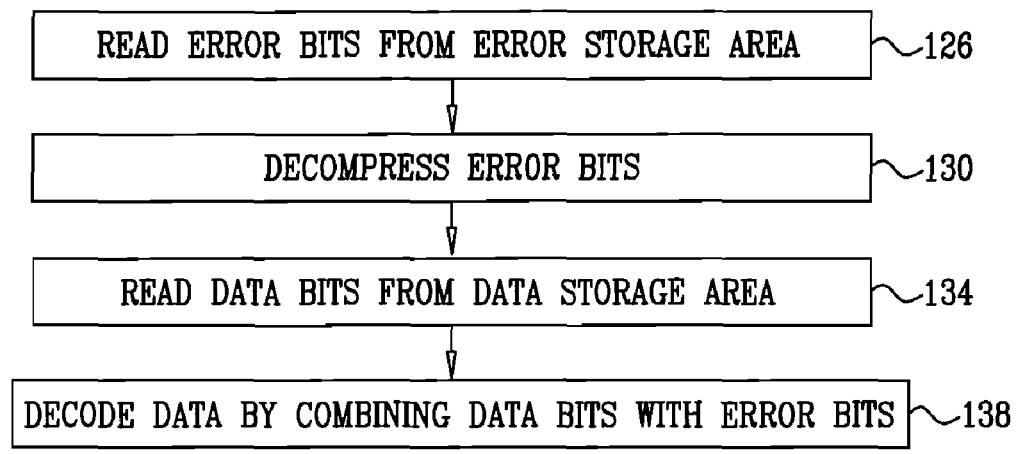
FIG. 5 is a flow chart that schematically illustrates a method for retrieving data from a memory cell array, in accordance with an embodiment of the present invention.

FIG. 5 is a flow chart that schematically illustrates a method for retrieving data from a memory cell array, in accordance with an embodiment of the present invention. The data is assumed to be stored using the method of FIG. 4 above. The method begins with the MSP reading the error information (in the present example, the quantized and compressed residual errors) from the error storage area, at an error reading step 126. The MSP decompresses the errors, at a decompression step 130. In configurations in which the error information is encoded, the MSP decodes the ECC at this stage.

The MSP reads the data stored in the data storage area, at a data reading step 134. Since the data was stored using a large P&V step size, the analog values read from the cells may have large deviations from the corresponding target values. The MSP corrects these deviations using the error information retrieved at steps 126 and 130 above. The MSP decodes and reconstructs the data by combining the data read from the data storage area and the error information read from the error storage area, at a decoding step 138.

In some embodiments, the MSP caches error information that was previously read, so that not every read operation from the data storage area necessarily requires another read operation from the error storage area. For example, since typically K<N, a certain error storage page may contain error information pertaining to multiple data storage pages. Thus, the MSP may cache the read error storage pages and, when a data storage page is read, used the cached error information for this page, if available.

In some embodiments, the MSP may read and use the error information only selectively, e.g., when the data retrieved from the data storage area cannot be retrieved successfully. In these embodiments, the MSP first reads the data from the data storage area and attempts to reconstruct it without error information. If data reconstruction is successful, the MSP does not read the error information from the error storage area, thus reducing the number of read operations. If data reconstruction fails, the MSP reads the error information and uses it to reconstruct the data.

The MSP can determine whether data reconstruction is successful using any suitable method. For example, the MSP may encode the data stored in the data storage area with an ECC, or with an error detection code such as a Cyclic Redundancy Check (CRC). The MSP reverts to reading and using the error information when the ECC cannot be decoded successfully or when the error detection code indicates an error.

Figure 6:
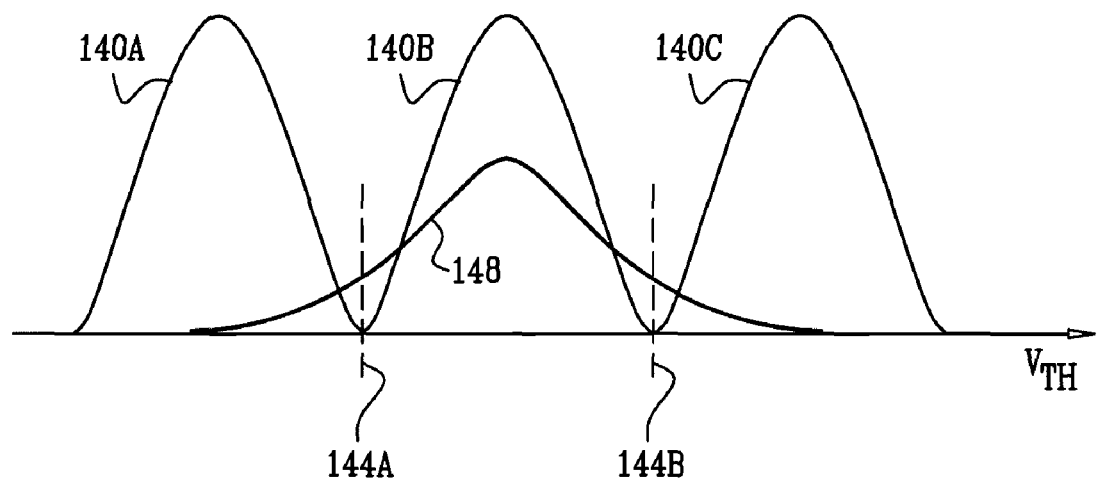
FIG. 6 is a graph showing voltage distributions in a memory cell array, in accordance with an embodiment of the present invention.

FIG. 6 is a graph showing threshold voltage distributions in a memory cell array, in accordance with an embodiment of the present invention. In the present example, the cells of the memory array have three possible states, represented by three nominal threshold voltage levels. Because of the residual errors of the P&V process, the analog values that are actually programmed in the cells deviate statistically around the nominal values. (The stored analog values may also deviate from the nominal values for other reasons, such as due to various impairments and inaccuracies, some of which are addressed further below.)

Curves 140A . . . 140C show the threshold voltage distributions of the cells that were respectively programmed to the three different states. The cells are read by comparing their analog values to two thresholds 144A and 144B.

In the present example, curves 140A . . . 140C show the voltage distributions that are produced when programming the cells with a fine P&V step size. As can be appreciated, the distributions are relatively well separated from one another, so that the probability of error (i.e., a cell being programmed to a certain state but its analog value falling in an interval that corresponds to another state) is low.

A curve 148 shows a voltage distribution that is produced when programming the cells to the middle state using a coarse P&V step size. As can be seen in the figure, the variance of distribution 148 is considerably larger than the variance of distribution 140B. Programming with a smaller P&V step size can be viewed as tightening the threshold voltage distribution around the intended target value, and vice versa.

A non-negligible portion of distribution 148 falls below threshold 144A and above threshold 144B. These portions of the distribution are likely to correspond to errors. Thus, the error probability associated with a coarse P&V step size is considerably larger than the probability of error achieved by a small P&V step size. The parameters of the P&V process (e.g., the P&V step size and the maximum number of iterations) can be chosen so as to adjust the probability of error. Typically but not necessarily, the P&V parameters are chosen so that the number of cells whose analog values fall on the wrong side of the threshold is on the order of a few percents.

When errors occur, the analog value is most likely to fall in an adjacent state and not in a state that is further away. Thus, the residual errors can often be quantized into three possible values: $\{-1,0,+1\}$, respectively indicating an error falling in the next-lower adjacent state, no error, and an error falling in the next-higher adjacent state. Alternatively, the P&V step size and the programming thresholds can be selected so that the residual errors can be quantized into two possible values of $\{0,+1\}$.

In some embodiments, the MSP produces a vector of residual error values, whose elements comprise the quantized errors of the different cells. Typically, most of the vector elements will be zero, with an occasional 1 or −1 value. Such a vector can be efficiently compressed using any suitable lossless or lossy compression method known in the art, such as by using run length encoding, using methods based on the well-known Lempel-Ziv algorithm, or any other suitable method. As another example, the MSP may store only the indices of the cells in which errors were detected along with the quantized values of these errors. Alternatively, the MSP may encode the error vector using run-length encoding.

Figure 7:
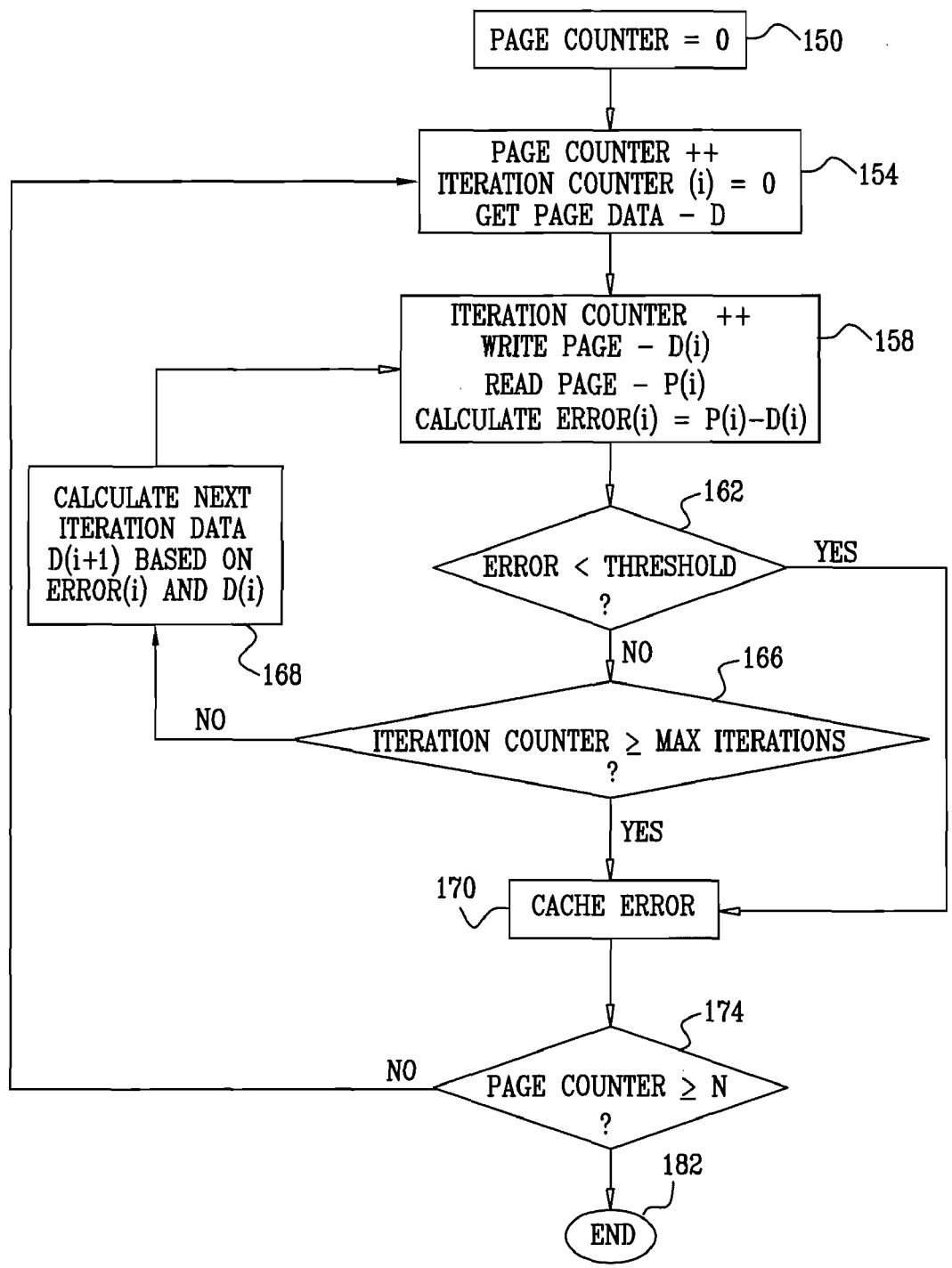
FIG. 7 is a flow chart that schematically illustrates a method for storing data in a memory cell array, in accordance with an embodiment of the present invention.

FIG. 7 is a flow chart that schematically illustrates a method for storing data in a memory cell array, in accordance with an embodiment of the present invention. FIG. 7 shows a P&V process that programs a block of N pages, which roughly corresponds to steps 110 and 114 of the method of FIG. 4 above. The process comprises an outer loop (steps 154-174), which runs over the N pages of the block, and an inner loop (steps 158-166), which runs over the P&V iterations of a certain page.

The method begins with the MSP initializing a page counter to zero, at a block initialization step 150. In order to program the current page, the MSP initializes the variables of the page, at a page initialization step 154 the MSP increments the page counter to reflect the current page number, initializes the P&V iteration counter (denoted i) to zero, and gets the data to be written to the page (denoted D). Then, the MSP and R/W unit carry out the inner loop (P&V) process for programming the current page.

The R/W unit carries out the $i^{th}$ P&V iteration, at a P&V iteration step 158. In this step, the R/W unit increments the iteration counter i, writes the analog values of iteration i (denoted D(i)) to the memory cells of the page, and reads the values from the programmed cells in order to verify them. The error of iteration i is calculated by comparing the read values (denoted P(i)) with the written values D(i). (The written values D(i) may differ from one P&V iteration to another since the programming of cells stops when reaching their intended levels.)

The R/W unit checks whether the error after the $i^{th}$ iteration is smaller than a predetermined threshold, at a threshold comparison step 162. Note that D(i), P(i), used in step 158, as well as the difference between them denoted ERROR(i), are vectors whose elements correspond to the individual cells in the programmed page.

The MSP counts the number of cells in the page having an error. If this number is larger than the threshold, the R/W unit checks whether the maximum number of iterations is completed, at a maximum iterations checking step 166.

If not (i.e., when the number of cells that have not reached their intended levels exceeds the threshold, and provided the maximum number of iterations have not yet been exhausted), the R/W determines the analog values to be written in the next iteration, at a next iteration data calculation step 168. The R/W unit calculates D(i+1) based on the residual error of the previous iteration and on the values D(i) of the previous iteration. Typically, D(i+1) comprises values for only the cells that have not yet reached their target levels. The method then loops back to step 158 above, in which the R/W unit carries out the next P&V iteration.

If, on the other hand, programming of the current page is completed (either because all cells reached their intended levels or because the maximum number of iterations have been completed), the MSP caches the residual errors of the current page, at a caching step 170.

The MSP checks whether all N pages have been programmed, at a page checking step 174. If not all pages have been programmed, the method loops back to step 154 above for programming the next page. Otherwise, the method terminates, at a termination step 182. At this stage, the MSP holds the cached residual errors of the memory cells in the N pages, and is able to derive the error information and store it in the error storage area.

In some embodiments, the MSP sets and controls the size of the error information, and thus allocates space in the error storage area, in a dynamic and flexible manner. For a certain body of data stored in the data storage area, the MSP may allocate cells in the error storage area depending on the number and type (e.g., severity) of errors that were found in the cells that store the data, and/or the available space in the error storage area.

In a certain implementation, the MSP may allocate one data page (e.g., 4K bytes) for storing the error information related to a group of 255 data pages. When performing the method of FIG. 7 above, the MSP can modify the threshold used in step 162 based on the amount of memory that was already allocated for storing error information and/or the number of pages that still remain to be programmed. For example, assume a situation in which the MSP has already programmed N/4 out of the N data pages, and has already allocated 50% of the space allocated for error information for storing the error information of these N/4 pages. In such a scenario, the MSP can lower the threshold used in step 162 in order not to exceed the space available for error information. The use of a lower threshold reduces the size of the error information and extends the programming time.

When using the programming methods described herein, the MSP can control the size of the error storage area and the programming speed by selecting different programming parameters, such as the P&V step size and/or the P&V termination threshold (the threshold used in step 162 of FIG. 7). Different choices of programming parameters provide different capacity/speed trade-offs.

In some embodiments, the MSP may initially store the data with a certain choice of programming parameters, which provide fast programming at the expense of lower memory capacity. At a later stage, the MSP can reconstruct the data using the error information, and re-program the data in a different area of the memory using programming parameters that provide higher capacity. The reconstruction and re-programming operations may be carried out by a background task.

For example, the MSP may initially program the data using a relatively coarse P&V step size, which achieves fast programming but generates a large amount of error information. At a later time, the MSP can reconstruct the data using the error information, and re-program the data using a smaller P&V step size. The error information produced by the re-programming operation occupies less memory space than the original error information, because of the smaller P&V step size.

As noted above, the MSP sometimes compresses the error information. In some embodiments, the interface between the MSP and the memory device (or more specifically, the interface between the MSP and the R/W unit) contains commands that transfer the compressed error information, and thus reduce the data transfer between the MSP and the memory.

For example, since in many practical cases the majority of (quantized) errors are zero, the R/W unit can send only the indices and values of the non-zero elements in the error vector to the MSP.

Additionally or alternatively, the R/W unit may calculate statistical characteristics of the errors, and transfer these characteristics to the MSP. In particular, the R/W unit may calculate and transfer a histogram of quantized error values, e.g., the number of elements in the error vector that are equal to each possible quantized error value. The MSP can use the statistical characteristics sent by the memory device for deciding when to terminate the programming operation, and/or for determining the error information parameters.

Delayed Measurement of the Residual Errors

In the description above, the MSP measures the residual errors for the cells of a certain page immediately after programming the page. In alternative embodiments, the MSP measures the residual errors at a later time, or in response to a certain event or condition that occurs after the page was programmed. In many practical cases, the delayed error measurement provides considerable performance benefits.

For example, in some memory devices, the analog values of memory cells in a certain page are affected by other pages, such as by the values stored in the cells of the other pages and/or by memory access operations performed on the other pages. Such impairments may comprise, for example, cross-coupling interference between cells of different pages and/or disturb noise caused in a certain page by read and write operations on another page. In such cases, the MSP may measure the residual errors of a certain page after the potentially-interfering pages have also been programmed. When the residual errors are measured after the potentially-interfering pages have already been programmed, the residual errors of the interfered page will contain the impairment effects caused by these pages. When the residual errors reflect the impairments, the MSP will inherently compensate for the impairments when decoding the data based on the error information.

Delayed measurement of the residual errors may also improve performance in the presence of aging effects. Aging is a process in which the analog value stored in the cell gradually drifts over time from the initially-programmed value. Experience shows that in some memory devices the analog values drift considerably during the first few minutes after programming. Thus, measuring the residual programming errors a few minutes after the page is programmed causes the residual errors to contain the initial drift, which can then be compensated for during reading.

Delayed error measurement can similarly compensate for other impairments that occur between the time the cells are programmed and the time the residual errors are measured. The MSP may measure the residual errors at any time after the cells were programmed, e.g., immediately after programming, several minutes or even years after programming. In some embodiments, the MSP may re-measure the residual errors after a certain period of time and update the stored error information. The MSP may run a background, low priority task that measures residual errors and updates error information during normal system operation.

In some embodiments, the MSP may encode the data stored in the data storage area using an Error Correction Code (ECC), which is able to correct a certain finite number of errors in a page. In these embodiments, the MSP may decide to measure the residual errors and store the error information when the number of errors corrected by the ECC approaches the correction capability of the code.

For example, assume the ECC is able to correct 30 errors per page or per sector. During normal operation, the MSP counts the number of errors corrected by the ECC. When the number of corrected errors reaches 25 (e.g., because of aging or other effects), the MSP measures the residual errors and stores the corresponding error information in the error storage area. When retrieving the data, the MSP first corrects some of the data bits using the retrieved error information, and only then provides the data to the ECC decoder. Thus, the effective correction capability of the code is increased considerably.

Additionally or alternatively, the data stored in the data storage area can be encoded with an error detection code. The MSP may decide to measure the residual errors and store the error information based on the number of errors detected by the error detection code. Thus, generally, the decision can be based on any suitable code that is able to detect errors in the stored data.

In some embodiments, the data storage area and error storage area may overlap. For example, when the memory cells comprise multi-level cells, the MSP may store data in one or more bits of the memory cells, and store error information in one or more other bits of the cells.

Although the embodiments described herein refer mainly to P&V processes that program an entire memory page simultaneously, the methods and systems described herein can also be used with other kinds of cell programming processes, whether or not they contain a verification stage. Such programming processes may perform simultaneous programming of any suitable group of cells, or even program each cell individually.

Although the embodiments described herein mainly address storing data in solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for operating a memory that includes a plurality of analog memory cells, comprising:
   storing data in a first group of the memory cells by writing respective first analog cell values to the memory cells in the first group;
   after storing the data, reading respective second analog cell values from the memory cells in the first group, and finding differences between the respective first and second analog cell values for each of one or more of the memory cells in the first group;
   processing the differences to produce error information;
   storing the error information in a second group of the memory cells; and
   retrieving the stored data by retrieving the error information from the second group of the memory cells, reading third analog cell values from the cells in the first group, and processing the third analog cell values responsively to the retrieved error information to produce corrected data.

2. The method according to claim 1, wherein the second group of the memory cells is different from the first group.

3. The method according to claim 1, wherein writing the first analog cell values and reading the second analog cell values comprise programming the memory cells of the first group in an iterative Program and Verify (P&V) process.

4. The method according to claim 1, wherein processing the differences comprises quantizing the differences by mapping the differences to a finite set of difference indications, and wherein storing the error information comprises storing the quantized differences.

5. The method according to claim 4, wherein processing the differences comprises adaptively controlling a size of the produced error information responsively to the quantized differences.

6. The method according to claim 4, wherein storing the data comprises selecting the first analog cell values from a set of nominal values, and wherein the difference indications indicate whether the nominal values corresponding to the read second analog cell values differ from the respective nominal values corresponding to the written first analog cell values.

7. The method according to claim 6, wherein, for a given first analog cell value that corresponds to a first nominal value and a given second analog cell value that corresponds to a second nominal value, the difference indications comprise at least one of:
   a first indication indicating that the first nominal value is lower than and adjacent to the second nominal value in the set of the nominal values;
   a second indication indicating that the first nominal value is greater than and adjacent to the second nominal value in the set of the nominal values; and
   a third indication indicating that the first nominal value is equal to the second nominal value.

8. The method according to claim 1, wherein storing the error information comprises compressing the error information and storing the compressed error information.

9. The method according to claim 1, wherein storing the error information comprises encoding the error information with an Error Correction Code (ECC) and storing the encoded error information.

10. The method according to claim 1, wherein storing the error information comprises storing indices of the memory cells of the first group in which the differences were found.

11. The method according to claim 1, wherein reading the second analog cell values and finding the differences are performed immediately after writing the first analog cell values.

12. The method according to claim 1, wherein reading the second analog cell values and finding the differences are performed a predetermined time interval after writing the first analog cell values.

13. The method according to claim 1, wherein the memory cells in the first group are subject to interference from a third group of the memory cells, and wherein reading the second analog cell values and finding the differences are performed after the memory cells in the third group have been programmed.

14. The method according to claim 1, wherein reading the second analog cell values and finding the differences are performed responsively to an event.

15. The method according to claim 1, wherein retrieving the stored data comprises making an attempt to reconstruct the data from the third analog cell values without the error information, and retrieving the error information and processing the third analog cell values responsively to the retrieved error information upon a failure of the attempt.

16. The method according to claim 1, wherein storing the data comprises encoding the data with a code that detects errors in the data, and wherein retrieving the stored data comprises detecting the errors in the data using the code and updating the error information based on the third analog cell values when a number of the detected errors meets a predetermined condition.

17. The method according to claim 16, wherein updating the error information is performed when the number of the detected errors exceeds a predetermined threshold.

18. The method according to claim 1, wherein storing the data comprises programming the first memory cells using first programming parameters such that the error information has a first size, and comprising, after retrieving the stored data,
    re-programming the data using second programming parameters so as to produce refined error information having a second size, which is smaller than the first size.

19. The method according to claim 1, wherein finding the differences comprises determining respective residual programming errors caused by writing of the first analog cell values to the memory cells in the first group, and wherein processing the third analog cell values comprises correcting the residual programming errors based on the retrieved error information.

20. An apparatus for operating a memory that includes a plurality of analog memory cells, comprising:
    Read/Write (R/W) circuitry, which is coupled to store data in a first group of the memory cells by writing respective first analog cell values to the memory cells in the first group and, after storing the data, to read respective second analog cell values from the analog memory cells in the first group; and
    a processor, which is configured to find differences between the respective first and second analog cell values for each of one or more of the memory cells in the first group, to process the differences to produce error information, to store the error information in a second group of the memory cells, and to retrieve the stored data by retrieving the error information from the second group of the memory cells, reading third analog cell values from the cells in the first group, and processing the third analog cell values responsively to the retrieved error information to produce corrected data.

21. The apparatus according to claim 20, wherein the second group of the memory cells is different from the first group.

22. The apparatus according to claim 20, wherein the R/W circuitry is coupled to program the memory cells of the first group in an iterative Program and Verify (P&V) process.

23. The apparatus according to claim 20, wherein the processor is configured to quantize the differences by mapping the differences to a finite set of difference indications, and to store the quantized differences in the second group of the memory cells.

24. The apparatus according to claim 23, wherein processing the differences comprises adaptively controlling a size of the produced error information responsively to the quantized differences.

25. The apparatus according to claim 23, wherein the R/W circuitry is coupled to select the first analog cell values from a set of nominal values, and wherein the difference indications indicate whether the nominal values corresponding to the read second analog cell values differ from the respective nominal values corresponding to the written first analog cell values.

26. The apparatus according to claim 25, wherein, for a given first analog cell value that corresponds to a first nominal value and a given second analog cell value that corresponds to a second nominal value, the difference indications comprise at least one of:
    a first indication indicating that the first nominal value is lower than and adjacent to the second nominal value in the set of the nominal values;
    a second indication indicating that the first nominal value is greater than and adjacent to the second nominal value in the set of the nominal values; and
    a third indication indicating that the first nominal value is equal to the second nominal value.

27. The apparatus according to claim 20, wherein the processor is configured to compress the error information and to store the compressed error information.

28. The apparatus according to claim 20, wherein the R/W circuitry is coupled to compare the respective first and second analog cell values to produce the differences, to compress the differences and to send the compressed differences to the processor.

29. The apparatus according to claim 20, wherein the processor is configured to encode the error information with an Error Correction Code (ECC) and to store the encoded error information.

30. The apparatus according to claim 20, wherein the processor is configured to store indices of the memory cells of the first group in which the differences were found.

31. The apparatus according to claim 20, wherein the processor and the R/W circuitry are configured to read the second analog cell values and to find the differences immediately after writing the first analog cell values.

32. The apparatus according to claim 20, wherein the processor and the R/W circuitry are configured to read the second analog cell values and to find the differences a predetermined time interval after writing the first analog cell values.

33. The apparatus according to claim 20, wherein the memory cells in the first group are subject to interference from a third group of the memory cells, and wherein the processor and the R/W circuitry are configured to read the second analog cell values and to find the differences after the memory cells in the third group have been programmed.

34. The apparatus according to claim 20, wherein the processor and the R/W circuitry are configured to read the second analog cell values and to find the differences responsively to an event.

35. The apparatus according to claim 20, wherein the processor is configured to make an attempt to reconstruct the data from the third analog cell values without the error information, and to retrieve the error information and process the third analog cell values responsively to the retrieved error information upon a failure of the attempt.

36. The apparatus according to claim 20, wherein the processor is configured to encode the data with a code that detects errors in the data, to store the encoded data in the first group of the memory cells, and, when retrieving the stored data, to detect the errors in the data using the code and to update the error information based on the third analog cell values when the number of the detected errors meets a predetermined condition.

37. The apparatus according to claim 36, wherein the processor is configured to update the error information when the number of the detected errors exceeds a predetermined threshold.

38. The apparatus according to claim 20 wherein the processor is configured to run a background task that finds the differences and produces the error information.

39. The apparatus according to claim 20, wherein the processor is configured to program the first group of the memory cells using first programming parameters such that the error information has a first size, and, after retrieving the stored data, to re-program the data using second programming parameters so as to produce refined error information having a second size, which is smaller than the first size.

40. The apparatus according to claim 20, wherein the differences comprise respective residual programming errors caused by writing of the first analog cell values to the memory cells in the first group, and wherein the processor is configured to correct the residual programming errors based on the retrieved error information.

41. An apparatus for data storage, comprising:

a memory, which comprises a plurality of analog memory cells;

Read/Write (R/W) circuitry, which is coupled to store data in a first group of the memory cells by writing respective first analog cell values to the memory cells in the first group and, after storing the data, to read respective second analog cell values from the analog memory cells in the first group, and a processor, which is configured to find differences between the respective first and second analog cell values for each of one or more of the memory cells in the first group, to process the differences to produce error information, to store the error information in a second group of the memory cells, and to retrieve the stored data by retrieving the error information from the second group of the memory cells, reading third analog cell values from the cells in the first group, and processing the third analog cell values responsively to the retrieved error information to produce corrected data.

* * * * *